United States Patent
Williams et al.

(10) Patent No.: US 10,353,005 B2
(45) Date of Patent: Jul. 16, 2019

(54) TECHNIQUE FOR SELF LEARNING MOTOR LOAD PROFILE

(71) Applicant: ITT MANUFACTURING ENTERPRISES LLC, Wilmington, DE (US)

(72) Inventors: Dean Patrick Williams, Moravia, NY (US); Naveen Regi George, Rochester, NY (US); Kenneth Lee Hauenstein, Seneca Falls, NY (US)

(73) Assignee: ITT MANUFACTURING ENTERPRISES LLC, Wilmington, DE (US)

( * ) Notice: Subject to any disclaimer, the term of this patent is extended or adjusted under 35 U.S.C. 154(b) by 46 days.

(21) Appl. No.: 15/648,838

(22) Filed: Jul. 13, 2017

(65) Prior Publication Data

US 2019/0018066 A1 Jan. 17, 2019

(51) Int. Cl.
  *G01R 31/34* (2006.01)
  *G06N 20/00* (2019.01)
  (Continued)

(52) U.S. Cl.
  CPC ........... *G01R 31/343* (2013.01); *G01R 31/34* (2013.01); *G01R 33/02* (2013.01); *G06N 20/00* (2019.01);
  (Continued)

(58) Field of Classification Search
  None
  See application file for complete search history.

(56) References Cited

U.S. PATENT DOCUMENTS

| 4,495,448 A | 1/1985 | Dumbeck |
| 4,506,218 A | 3/1985 | Brown et al. |

(Continued)

FOREIGN PATENT DOCUMENTS

| AU | 2015249207 A1 | 11/2015 |
| CA | 2173375 A1 | 8/1990 |

(Continued)

OTHER PUBLICATIONS

Kim, Kyusung, and Alexander G. Parlos, "Induction motor fault diagnosis based on neuropredictors and wavelet signal processing," IEEE/ASME Transactions on mechatronics vol. 7, No. 2, Jun. 2002, pp. 201-219. http://parlos.tamu.edu/journal/tmech2002.pdf.

(Continued)

*Primary Examiner* — Clayton E. LaBalle
*Assistant Examiner* — Jas A Sanghera
(74) *Attorney, Agent, or Firm* — Moritt Hock & Hamroff LLP; Bret P. Shapiro

(57) ABSTRACT

Apparatus featuring a signal processor or signal processing module configured to: receive signaling containing information about a sampled leakage magnetic flux sensed from a motor, a motor load profile containing a learned leakage magnetic flux sensed from the motor and stored during a learning stage, and a user selectable band of tolerance related to the motor load profile to trigger an alarm condition for the motor; and determine corresponding signaling containing information about whether to trigger the alarm condition for the motor if the sampled leakage magnetic flux is outside the user selectable band of tolerance of the motor load profile, based upon the signaling received. The leakage magnetic flux may be sensed by, and/or received from, a motor flux leakage sensor arranged on an external surface of a frame of the motor.

28 Claims, 7 Drawing Sheets

(51) Int. Cl.
*G01R 33/02* (2006.01)
*H02P 29/024* (2016.01)
*H02H 7/08* (2006.01)
*H02P 23/00* (2016.01)

(52) U.S. Cl.
CPC ........... *H02H 7/08* (2013.01); *H02P 23/0031* (2013.01); *H02P 29/024* (2013.01)

(56) References Cited

U.S. PATENT DOCUMENTS

| | | | |
|---|---|---|---|
| 4,761,703 | A | 8/1988 | Kliman et al. |
| 4,823,067 | A | 4/1989 | Weber |
| 5,033,012 | A | 7/1991 | Wohld |
| 5,239,874 | A | 8/1993 | Hale |
| 5,629,870 | A | 5/1997 | Farag et al. |
| 5,739,698 | A | 4/1998 | Bowers et al. |
| 6,035,265 | A | 3/2000 | Dister et al. |
| 6,087,796 | A | 7/2000 | Canada et al. |
| 6,128,583 | A | 10/2000 | Dowling |
| 6,138,078 | A | 10/2000 | Canada et al. |
| 6,262,550 | B1 | 7/2001 | Kliman et al. |
| 6,330,525 | B1 | 12/2001 | Hays et al. |
| 6,483,319 | B1 | 11/2002 | Kendig et al. |
| 6,529,135 | B1 | 3/2003 | Bowers et al. |
| 6,559,654 | B2 | 5/2003 | Ho et al. |
| 6,721,683 | B2 | 4/2004 | Harris et al. |
| 6,727,725 | B2 | 4/2004 | Devaney et al. |
| 6,774,601 | B2 | 8/2004 | Schwartz et al. |
| 7,080,508 | B2 | 7/2006 | Stavale et al. |
| 7,112,037 | B2 | 9/2006 | Sabini et al. |
| 7,117,125 | B2 | 10/2006 | Dimino et al. |
| 7,135,830 | B2 | 11/2006 | El-Ibiary |
| 7,184,902 | B2 | 2/2007 | El-Ibiary |
| 7,208,910 | B1 | 4/2007 | Kumar et al. |
| 7,231,319 | B2 | 6/2007 | Dimino et al. |
| 7,254,514 | B2 | 8/2007 | House et al. |
| 7,346,475 | B2 | 3/2008 | Dimino et al. |
| 7,508,159 | B2 | 3/2009 | Kumar et al. |
| 7,559,240 | B2 | 7/2009 | Iwatsubo et al. |
| 7,712,367 | B2 | 5/2010 | Eckert et al. |
| 7,777,516 | B2 | 8/2010 | Zhou et al. |
| 7,813,906 | B2 | 10/2010 | Shiromaru et al. |
| 8,052,621 | B2 | 11/2011 | Wallace et al. |
| 8,219,335 | B2 | 7/2012 | Marti et al. |
| 8,675,321 | B2 | 3/2014 | Fortner |
| 9,050,894 | B2 | 6/2015 | Banerjee et al. |
| 9,160,260 | B1 | 10/2015 | Keas |
| 9,207,001 | B1 | 12/2015 | Roth et al. |
| 9,261,562 | B2 | 2/2016 | Lee et al. |
| 9,276,515 | B2 | 3/2016 | Yeh |
| 9,484,791 | B2 | 11/2016 | Brockerhoff et al. |
| 2007/0118307 | A1 | 5/2007 | El-Ibiary |
| 2013/0096853 | A1 | 4/2013 | Mahalingam et al. |
| 2015/0226805 | A1 | 8/2015 | Albers et al. |
| 2016/0020677 | A1 | 1/2016 | Sauer |
| 2016/0249915 | A1 | 9/2016 | Beckman et al. |
| 2016/0249916 | A1 | 9/2016 | Shelton, IV et al. |
| 2016/0249917 | A1 | 9/2016 | Beckman et al. |
| 2017/0082692 | A1 | 3/2017 | Mulay et al. |

FOREIGN PATENT DOCUMENTS

| | | |
|---|---|---|
| CN | 101363901 B | 12/2010 |
| CN | 104502757 A | 4/2015 |
| DE | 4316783 C2 | 7/1996 |
| DE | 102011083568 A1 | 3/2013 |
| GB | 2253957 A | 9/1992 |
| GB | 2466472 A | 6/2010 |
| KR | 20050075808 A | 7/2005 |
| KR | 100812303 B1 | 3/2008 |
| RU | 2473921 C1 | 1/2013 |
| RU | 2485534 C1 | 6/2013 |
| WO | 9306447 A1 | 4/1993 |

OTHER PUBLICATIONS

McBrien, Edward F., and H. B. Tryon, "Summary of electric vehicle dc motor-controller tests," Sep. 1982. http://ntrs.nasa.gov/archive/nasa/casi.ntrs.nasa.gov/19820025760.pdf.

Echavarria, Erika, Tetsuo Tomiyama, and Gerard JW van Bussel, "Fault Diagnosis approach based on a model-based reasoner and a functional designer for a wind turbine. An approach towards self-maintenance," Journal of Physics: Conference Series, vol. 75. No. 1. IOP Printed Jan. 2017. http://www.windenergy.lr.tudelft.nl/fileadmin/Faculteit/LR/Organisatie/Afdelingen_en_Leerstoelen/Afdeling_AEWE/Wind_Energy/Research/Publications/Publications_2007/doc/2007_May_31_-_reviewed_Jun_18_v2.pdf.

Webber, C. J. S., et al., "Componential coding in the condition monitoring of electrical machines Part 1: principles and illustrations using simulated typical faults," Proceedings of the Institution of Mechanical Engineers, Part C: Journal of Mechanical Engineering Science vol. 217, Part C, May 22, 2003, pp. 883-899 http://eprints.hud.ac.uk/2288/1/fulltext3.pdf.

Payne, B. S., et al., "Componential coding in the condition monitoring of electrical machines Part 2: application to a conventional machine and a novel machine," Proceedings of the Institution of Mechanical Engineers, Part C, Journal of Mechanical Engineering Science vol. 217, Part C, May 22, 2003, pp. 901-915. http://eprints.hud.ac.uk/6810/1/fulltext.pdf.

English language Abstract of DE4316783.
English language Abstract of DE102011083568.
English language Abstract of KR100812303.
English language Abstract of KR20050075808.
English language Abstract of RU2473921.
English language Abstract of RU2485534, also published as RU2011143004.
English language Abstract of CN101363901.
English language Abstract of CN104502757.

Fournier Etienne et al., "A Generic Diagnosis Protocol for the Monitoring of Induction Motors Based on Multiple Statistical References in the Torque-Speed Plane," IECON 2014--40th Annual Conference of the IEEE Industrial Electronics Society, IEEE, Oct. 29, 2014, pp. 3348-3354, retrieved on Feb. 24, 2015, complete document.

Pusca, Remus, et al., "Advances in Diagnosis of Electrical Machines through External Magnetic Field," 2015 7th International Conference On Electronics Computers, and Artificial Intelligence (ECAI), IEEE, Jun. 25, 2015, retrieved on Oct. 19, 2015, complete document.

Apparatus 10

Signal processor or processing module 10a configured at least to:

receive signaling containing information about a sampled leakage magnetic flux sensed from a motor, a motor load profile containing a learned leakage magnetic flux sensed from the motor and stored during a learning stage, and a user selectable band of tolerance related to the motor load profile to trigger an alarm condition for the motor;

determine corresponding signaling containing information about whether to trigger the alarm condition for the motor if the sampled leakage magnetic flux is outside the user selectable band of tolerance of the motor load profile, based upon the signaling received; and/or provide the corresponding signaling containing information about the about the alarm condition, including for further processing.

Other signal processor circuits or components 10b that do not form part of the underlying invention, e.g., including input/output modules, one or more memory modules, data, address and control busing architecture, etc.

Motor 20, e.g., configured to drive a pump, having an outer frame 20a with a motor leakage flux detector 20b thereto.

Pump 30, e.g., configured to be driven by the motor 20

Figure 5

The Flowchart 50

Step 50a: receiving in a signal processor or processing module 10a signaling containing information about a sampled leakage magnetic flux sensed from a motor, a motor load profile containing a learned leakage magnetic flux sensed from the motor and stored during a learning stage, and a user selectable band of tolerance related to the motor load profile to trigger an alarm condition for the motor;

Step 50b: Determining in the signal processor or processing module 10a corresponding signaling containing information about whether to trigger the alarm condition for the motor if the sampled leakage magnetic flux is outside the user selectable band of tolerance of the motor load profile, based upon the signaling received; and/or Step 50c: Providing from the signal processor or processing module 10a the corresponding signaling containing information about the alarm condition, including for further processing.

Step 50d: Arranging an outer frame 20a of a motor 20 with a motor leakage flux detector 20b to sense the magnetic flux created by the current flowing Figure 7: The Basic Method/Algorithm

TECHNIQUE FOR SELF LEARNING MOTOR LOAD PROFILE

BACKGROUND OF THE INVENTION

1. Field of the Invention

This application relates to a technique for controlling a motor driving a pump.

2. Brief Description of Related Art

The following techniques are known in the art:

Techniques are known for sensing a load of a motor driving a variable torque load (e.g., a pump or fan) via an electrical current sensor. Current is proportional to load up to 150% on a standard AC induction motor. If the current reading is in excess of the motor's nameplate rating, a safety system senses the current, and shuts down the motor to prevent catastrophic failure and fire from overheating. This condition is defined as an "overload condition". (For example, see the www.NFPA.org and the reference entitled, "NFPA 70, National Electric Code" (NEC), available by the National Fire Protection Association (NFPA).) However, many times this high load condition may be an indication of a pump failure that started as a minor problem.

Conversely, techniques are also known for sensing and determining if the motor's current drops below a calibrated minimum level to trigger a fault indicating a process disruption (e.g., a broken belt, broken coupling, closed valve on a pump or closed damper on a blower). In this case, it may also be possible that before this current exceeds the maximum rating of the motor, the potential problem exists, and could be sensed before the condition becomes critical. (For example, see the PumpSmart technology commonly owned by the assignee of the instant application and identified below.)

Moreover, other techniques are also known in the art, including the following:

U.S. Pat. No. 5,245,496 discloses a self-programming non-invasive motor overload prevention technique that senses motor load via a current sensor and only locally protects against motor failure in an overload condition. However, the '496 technique does not track the motor load via leakage flux and use a flux sensor to sense changes in the load to indicate anomalies in operation before catastrophic damage occurs.

U.S. Pat. No. 5,680,025 discloses a proactive motor monitoring technique for avoiding premature failures and fault recognition that only senses motor flux frequency and "calculates" motor load.

U.S. Pat. No. 6,308,140 B1 discloses a motor condition and performance analyzer technique that senses motor current, not flux, and uses the motor current to detect broken rotor bars in the motor.

In view of this, there is a need in the industry for a better way for detecting pending motor failure with an accurate diagnosis in a motor driving a pump.

SUMMARY OF THE INVENTION

In summary, and in contrast to the prior art techniques set forth above, the present invention provides a new and unique technique for sensing motor flux non-invasively, and cancelling out sinusoid waveforms and using the resultant signal for baselining and trending, thereby allowing for accurate comparing and diagnosis for the purpose of indicating pending motor failure with an accurate diagnosis.

In operation, a pump operator can program in an actual pump load curve based off speed when commissioning a variable frequency drive (VFD) for controlling a motor driving a pump. Then, the pump operator can also program in a user selectable band of tolerance, e.g. say +/−15% of the curve to trigger an alarm condition. The alarm condition would not be a fault but rather an indicator that something is starting to fail or change in the system, and should be investigated.

In effect, it is a user selectable alarm that allows the pump operator to set the plus (+) level and the minus (−) level to set an alarm trigger band to trigger the alarm condition. It is important to note that one could change (e.g., decrease/increase) the "alarm" sensitivity by opening/closing the alarm trigger band.

By way of example, the new technique would be useful in conditions like the following:

The impeller starts to clog, flow decreases, load decreases,
Sludge or rags build up and cause binding, load increases,
Someone throttles an input valve and partial cavitation starts to occur, load decreases,
Bearings start to bind, load increases,
Impeller wear, load decreases,
Etc.

It is note that the assignee of the present application already has developed fault protection techniques, e.g., with dead head, no flow, run out/broken pipe protections. However, these fault protection techniques are primarily based off the minimum and maximums for the overall system.

This new and unique technique would place a tolerance based off a calibrated load curve vs. speed. This feature would just enhance protection by providing indicating alarms for technicians to investigate before a hard fault condition. This might be interpreted as more of a "Smart Pump VFD", e.g., consistent with the assignee's SmartPump technology identified below. It would be easy to establish this load curve calibration during the commissioning of the VFD. (Nb: it is generally noted that in applications where viscosity and fluid temperature change, this new technique might be not as useful, although one could compensate for temperature changes in fluid with other technologies developed by the assignee of the present application (e.g., see the assignee's EMD and iAlert technologies, commonly owned by the assignee of the instant application and identified below).)

SPECIFIC EMBODIMENTS OF THE PRESENT INVENTION

According to some embodiments, the present invention may take the form of apparatus, e.g., such as a controller for a motor driving a pump, featuring:

a signal processor or signal processing module configured to receive signaling containing information about a sampled leakage magnetic flux sensed from a motor, a motor load profile containing a learned leakage magnetic flux sensed from the motor and stored during a learning stage, and a user selectable band of tolerance related to the motor load profile to trigger an alarm condition for the motor; and determine corresponding signaling containing information about whether to trigger the alarm condition for the motor if the sampled leakage magnetic flux is outside the user selectable band of tolerance of the motor load profile, based upon the signaling received.

The present invention may also include one or more of the following features:

The leakage magnetic flux may be sensed by, and received from, a motor flux leakage sensor arranged on an external surface of a frame of the motor, the motor's shaft or motor peripherals arranged within a magnetic field generated by the motor.

The motor flux leakage sensor may be configured to connect to the signal processor having memory storage.

The motor flux leakage sensor may be configured to attach to the external surface of the frame of the motor, the motor's shaft or the motor peripherals using an adhesive, magnetic structure or mechanical fastener.

The motor flux leakage sensor may be configured to sense the leakage magnetic flux that produces a representative signal to a torque required to turn a shaft of the motor, including where the representative signal has a frequency proportional to a rotational speed of the motor.

The proportional signal sensed may include an amplitude or a frequency, including where the amplitude is proportional to a load of the motor is driving or experiencing, and the frequency is proportional to the speed of the motor.

The user selectable band of tolerance may be a percentage threshold of the motor load profile to trigger the alarm condition, including where the percentage threshold is user selectable of the motor load profile.

The alarm condition may contain an indication that the motor is starting to fail or that there is a change in the motor that should be investigated.

The corresponding signaling may include, or take the form of, providing an alarm, e.g., including an audio alarm, a visual alarm, or both.

The tolerance may be is based off a calibrated load curve versus speed.

The sampled leakage magnetic flux may be determined to be outside the user selectable band of tolerance of the motor load profile, when the sampled leakage magnetic flux is greater than (i.e., too high) or less than (i.e., too low) the user selectable band of tolerance of the motor load profile.

The signal processor or signal processing module may be configured to provide the corresponding signaling containing information about the alarm condition, including where the corresponding signaling includes wireless signaling transmitted for further processing.

The signal processor or signal processing module may be configured to implement a load curve calibration procedure during commissioning of a Variable Frequency Drive system for the motor.

The signal processor or signal processing module may be configured, during the learning stage, to store a flux magnitude as a value each time a transition is made in frequency increments. By way of example, the value may include, or take the form of a Root Mean Square (RMS) value.

The signal processor or signal processing module may be is configured, after a predetermined number of transitions, to establish or determine motor load profile containing the learned leakage magnetic flux sensed from the motor during the learning stage.

The signal processor or signal processing module may be configured to either average the learned leakage magnetic flux sensed and measured from the motor during the learning stage, or affix minimum and maximum values multiplied by a percentage margin, to establish or determine a motor load profile "bandwidth."

The signal processor or signal processing module may be configured to compare future leakage magnetic flux values against the motor load profile established, determined or learned.

The signal processor or signal processing module may be configured to store the value in a memory storage for compiling a statistically significant amount of the sampled leakage magnetic flux sensed to form a statistical function or technique, e.g., such as a Probability Density Function (PDF), including to build an aggregate of values in the motor load profile.

The signal processor or signal processing module may be configured to compare input signaling containing information about the sampled leakage magnetic flux sensed in relation to a standard deviation of the statistical function or technique, e.g., including the PDF.

The signal processor or signal processing module may be configured to determine an impact of the statistical function or technique to processing depending on a bin size of a histogram that makes up the statistical function or technique in order to determine anomalies, as well as process changes depending on the user selectable band of tolerance.

The signal processor or signal processing module may be configured to build the motor load profile having at least one leakage magnetic flux spectrum.

The signal processor or signal processing module may be configured to implement a technique to break down the at least one leakage magnetic spectrum using a spectral shape analysis into representations of vectors and numbers, including where the technique includes using a variation of spectral detectors.

The signal processor or signal processing module may be configured to implement a Fast Fourier Transform (FFT) analysis technique during the learning stage, including by receiving sampled leakage magnetic flux signaling sensed, performing the FFT analysis technique on the sampled leakage magnetic flux signaling, storing FFT sampled leakage magnetic flux signaling in a memory storage as the motor load profile for comparing to a current magnet flux spectrum later determined in the future.

The signal processor or signal processing module may be configured to determine the current magnetic flux spectrum, compare the current magnetic flux spectrum to the motor load profile, and determine the alarm condition if the current magnetic flux spectrum varies more than a predetermined percentage from the motor load profile.

The current magnet flux spectrum may include FFT leakage magnetic flux sensed, frequency bins and associated amplitudes at individual frequencies.

The signal processor or signal processing module may be configured, after populating the motor load profile, to compare the motor load profile to actual or sampled leakage magnetic flux values sensed, and determine the alarm condition if the actual or sampled leakage magnetic flux values sensed are outside the user selectable band of tolerance, including where the user selectable band of tolerance takes the form of an established bandwidth for a user defined period of time.

The signal processor or signal processing module may be configured to determine an alarm condition using a minimum, maximum and time based technique, including by recording each leakage magnetic flux data point and assigning a similar or same weight.

The signal processor or signal processing module may be configured to determine an alarm condition using a percentage of average and time based technique, including by recording each leakage magnetic flux data point at regular intervals over a fixed period of self learning time and assigning an averaged weight.

The signal processor may be configured to provide the corresponding signaling for further processing, including as control signaling.

The apparatus may include, or takes the form of, a controller, e.g., having the signal processor.

According to some embodiments, the apparatus may include, or takes the form of, a pump system having the controller with the signal processor for implementing the aforementioned signal processing functionality. The pump system may include the motor and a pump driven by the motor.

According to some embodiments, the present invention may take the form of a method featuring steps for:
receiving in a signal processor signaling containing information about a sampled leakage magnetic flux sensed from a motor, a motor load profile containing a learned leakage magnetic flux sensed from the motor and stored during a learning stage, and a user selectable band of tolerance related to the motor load profile to trigger an alarm condition for the motor; and
determining in the signal processor corresponding signaling containing information about whether to trigger the alarm condition for the motor if the sampled leakage magnetic flux is outside the user selectable band of tolerance of the motor load profile, based upon the signaling received.

The method may also include providing with the signal processor the corresponding signaling for further processing, including as control signaling, and/or include sensing the leakage magnetic flux with a motor flux leakage sensor arranged on an external surface of a frame of the motor, the motor's shaft or motor peripherals, as well as one or more of the features set forth herein.

In effect, by using a motor leakage flux sensor attached to the outer frame of the motor, one can non-invasively sense motor load. By trending motor load via leakage flux verses speed and time, one can intelligently program a motor load profile on a good working motor to establish a baseline. This unique baseline motor load profile can be used to compare against future anomalies to determine pending failures, or process disruptions, of the motor as time goes by, and into the future.

By way of still further example, other possible realizations may include the addition of current sensors to sense motor current verses leakage flux sensors, but the same method could be used to trend the motor load and compare future operations. Adding current sensors would not be a "non-invasive" solution, but could be incorporated into the assignee's pump smart algorithm.

By way of example, the assignee's iAlert technology mounted to the motor's frame may be configured to include a leakage flux sensor for implementing the present invention.

BRIEF DESCRIPTION OF THE DRAWING

The drawing, not necessarily drawn to scale, includes the following Figures:

FIG. 5 shows apparatus having a signal processor configured to process signaling received and determine corresponding signaling containing information about anomalies in a motor, e.g., for driving a pump, according to some embodiments of the present invention.

FIG. 7 shows a flowchart of a basic method/algorithm, according to some embodiments of the present invention.

Figures 1, 1A, 1B:
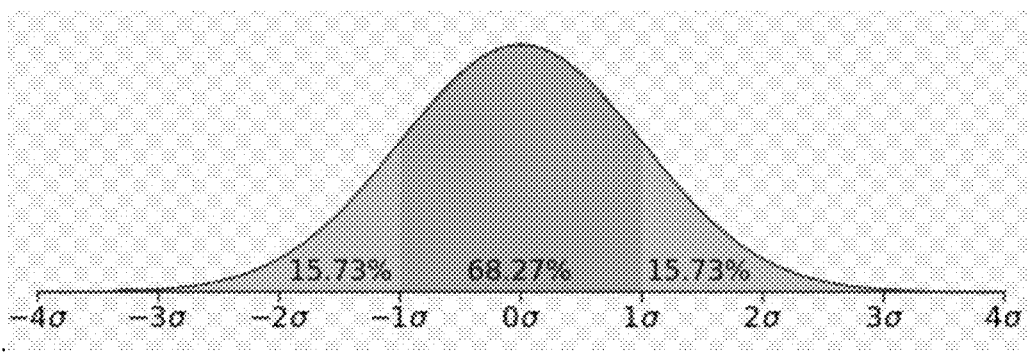
FIG. 1 includes FIGS. 1A and 1B, where
FIG. 1A shows a graphic representation of a probability density function (PDF), e.g., of root mean square valves sensed and measured during a learning stage, according to some embodiments of the present invention; and where
FIG. 1B is chart of distance from mean and minimum population for different standard deviations for the PDF shown in FIG. 1A.

Not every reference numeral is included in every Figure, e.g., so as to reduce clutter in the drawing as a whole.

DETAILED DESCRIPTION OF THE INVENTION

The Basic Invention

The present invention provides a solution to the aforementioned problem in the art, e.g. by creating a self learning motor load profile that may be used to provide alarms when motor conditions exceed a percentage threshold or deviation greater than a customer's defined margin (also known or referred to herein as a "user selectable band of tolerance").

By way of example, the system may include a motor flux leakage sensor connected to a microprocessor with memory storage. The entire assembly would be placed on an outside of the frame of the motor, e.g., attached with an adhesive or magnet structure. No modification of the motor enclosure would be required. The sensor would sense leakage magnetic flux, e.g., from the motor's stator. When the motor is operating, the motor's magnetic flux produces a proportional signal to the torque required to turn the motor's shaft, where the frequency of the signal is proportional to the motor's speed.

The signal or signaling sensed may include an amplitude, frequency, and wave shape. The amplitude is proportional to the load the motor is experiencing, and the frequency is proportional to the speed. All of these aspects are critical to the establishment of the "motor load profile," according to the present invention.

For example, during the "learning stage", the motor flux leakage sensor may be coupled to the microprocessor that stores a flux magnitude as an RMS value each time a transition is made, e.g. in frequency at 0.1 Hz increments. (The scope of the invention is not intended to be limited to any particular sampling increments.) After some predetermined number of transitions (e.g., 3, 4, 5, 6, etc.) have been made, that frequency's load profile may be established. The measurements may be either mathematically averaged, or affixed minimum (min) and maximum (max) values multiplied by a percentage margin. This would establish a motor load profile "bandwidth", according to the present invention. Any future magnetic flux values would actively be compared against this motor load profile established. See that shown in FIG. 1 below.

For the learning stage to get a more long term aggregate of the motor load profile, the RMS value could be stored for a statistically significant amount to form a Probability Density Function (PDF). The advantage of this method is so that it builds a long term motor load profile of the system and compares the input sensed to a collection of data gathered with regard to a standard deviation of the statistically significant set of data of the system.

The impact of the PDF to processing depends on the bin size of the histogram that would make up the PDF. This will catch any anomalies and, depending on the user, the threshold can be set to catch process changes as well.

As one skilled in the art would appreciate, building a profile of load with regard to a spectrum can be very intensive with respective to data that needs to be stored, i.e., to store multiple spectrums with all its data would mean being excessive with data storage, e.g., especially with a high resolution Spectrum mentioned above. According to some embodiments of the present invention, to lessen the load on data storage, the spectrum may be broken down using a spectral shape analysis into simple representation of vectors and numbers, including where the techniques includes using a variation of spectral detectors. This spectrum break down can help in relation to the data storage in terms of the space required, and can also help in relation to the transfer of such data as the data package size is greatly reduced. This technique can also help in getting a signature of the load profile through its life cycle more manageable, thereby enabling a pump operator to use this data for diagnosing health of other systems that fit the certain characteristics.

FFT-Based Analysis

Figure 2:
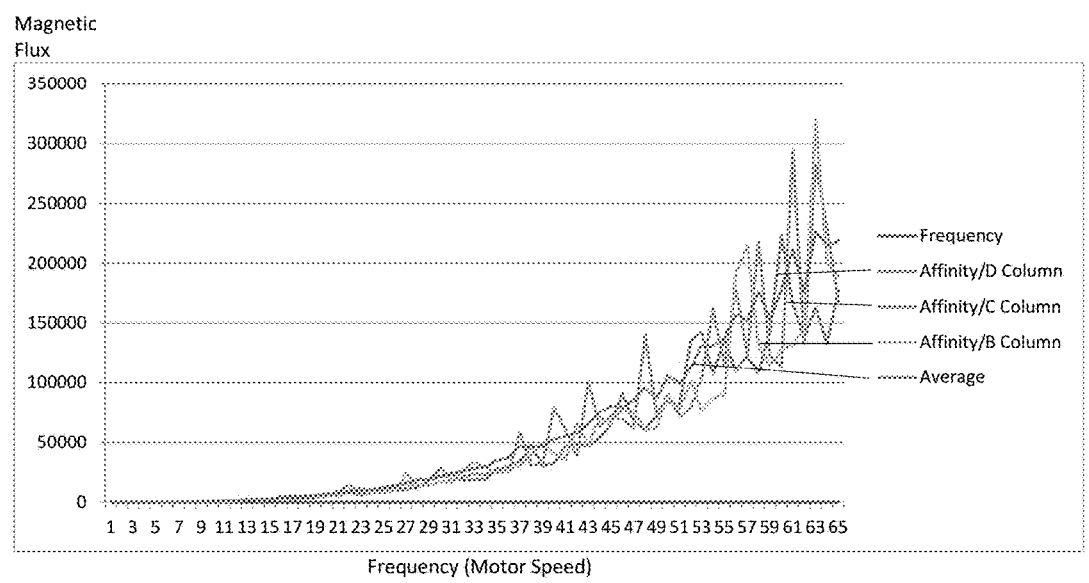
FIG. 2 shows a graph of magnetic flux versus frequency motor speed showing various plots.

By way of example, an FFT-based analysis may be used to process the magnetic flux densities sensed, as follows:

A flux signal may be sensed and read, an averaged FFT may be performed on a flux signal sensed and the data may be stored in non-volatile memory to be used to compare to a current flux spectrum later sensed. If the current flux spectrum varies more than a predetermined percentage from the stored flux spectrum, e.g. during the learning stage, then an alarm may be set and sent to the pump operator that there may be an unusual operation occurring. The flux spectrum may include the FFT data, frequency bins and the amplitude at the individual frequencies. See FIG. 2.

The number of stored data points is only limited by resolution and memory. After the motor load profile is populated, it could be used to compare against the actual data values sensed. If the data was outside the established bandwidth of tolerance for a user defined period of time, then an alarm condition could be determined and signaled, according to the present invention.

In order to avoid the prior art inaccuracies and imprecision, e.g., as set forth above, the present invention uses a much more accurate method of recording the load profile by populating each "frequency bin" with the appropriate value calculated during the self learning phase. This technique is far superior due to the greatly increased number of values recorded over the entire frequency range.

Technique for RMS Alarm Based on Min, Max and Time**

By way of example, the following technique may be used, which is an RMS alarm based on min, max and time, as follows:

The parameters are as follows:
X=Realtime Real time peak data point sensed,
Y hi=stored Real time peak data,
Y lo=stored Real time peak data, and
A=timer setpoint determined by customer.

The technique may include at least the following steps:
Step 10: If X>Y hi then over write Y hi, and then record stored counts in Z;
Step 20: If X<Y lo then over write Y lo, and then record stored counts in Z;
Step 30: When Z=5, then jump to steps 10, 20;
Step 35: When commission time=168 hours, then jump 10, 20;
Step 40: When Z=5, then compare X<Y lo, and trigger timer for A;
Step 50: If X<Y lo for >A, then alarm on "<Nominal Load";
Step 60: When Z=5, then compare X>Y hi, and trigger timer for A; and
Step 70: If X>Y hi for >A, then alarm on ">Nominal Load".

In summary, the above technique for the RMS alarm based on min, max and time records each data point so as to have (or be assigned) the same weight even though due to anomalies in the process, they may be rare occurrences verses regular operation.

Technique for RMS Alarm Based on Percentage of Average and Time**

Alternatively, and by way of further example, the following technique may be used, which is an RMS alarm based on percentage of average and time, as follows:

The parameters are as follows:
X=Realtime Real time peak data point sensed,
Y hi=stored Real time peak data,
Y lo=stored Real time peak data,
A=timer set point determined by customer,
B=% deviation from average, and
C=Average of X over 5 recorded data points.

The technique may include at least the following steps:
10: If X>Y hi then over write Y hi, and then record stored counts in Z;
20: If X<Y lo then over write Y lo, and then record stored counts in Z;
30: When Z=5, then jump 10, 20;
35: When commission time=some predetermined time (e.g., 168 hours), then jump to steps 10, 20;
40: When Z=5, then average Y hi and Y lo=C;
50: If X<(C*B) for >A, then alarm on "<Nominal Load";
60: (Blank)
70: If X>(C*B+C) for >A, then alarm on ">Nominal Load".

In summary, the averaging technique compensates for anomalies of motor load, especially if data points are recorded at regular intervals over a fixed period of self learning. By way of example, a predetermine time of 168 hours may be used in the example above, although the scope of the invention is not intended to be limited to any particular time.

Temperature Compensation**

By way of example, the present invention may be used in conjunction with a temperature compensation technique, which may be added based off the assignee's iAlert technology identified below. However, motor temperature can, and typically will, vary proportionally to the ambient temperature and load, not necessarily based of process temperature. By way of example, process temperature would be ideal as a correction factor. Because of this, embodiments are envisioned in which a MESH network approach may be implemented, e.g., using the assignee's iAlert technology identified below on both the pump and motor, so as to enable an exchange of known speed from the motor to pump, and pump temperature to motor for the load.

Data Processing

Figure 3:
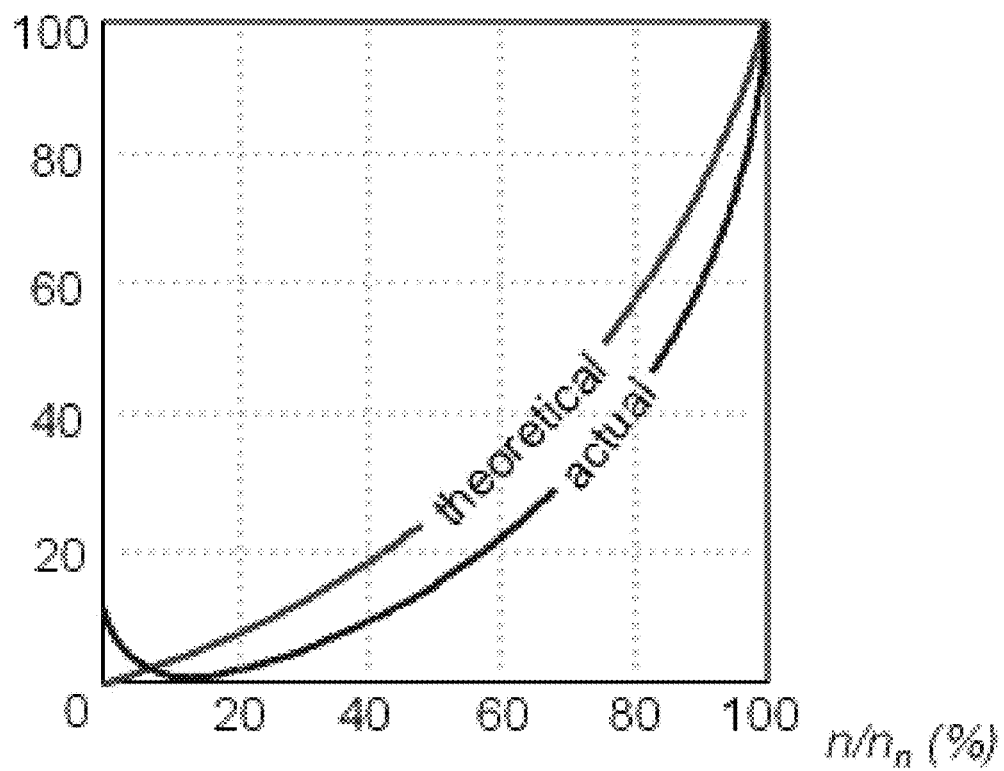
FIG. 3 shows a graph of torque ($T/T_n$ (%)) versus motor speed ($n/n_n$) having examples of a theoretical plot shown in relation to an actual plot.

As one skilled in the art would appreciate, if processing power is theoretically limitless, then the best technique would be one where the self learning mode runs continuously at the same time as the monitor mode is active. See FIG. 3.

The motor load may be monitored in real time, and peaks may be recorded as data points. The peaks may be recorded for the period of time that they are sustained, e.g., by multiplying the amplitude of the peak by the period of time sustained.

The longer the period sustained/and or the higher the peak, the greater the weight attached to that peak. For example, in the food and beverage industry, a caustic water wash down process needs to be performed every day. During this process, pumps may be required to run at a high speed and high motor load for 30 minutes. That motor load would be recorded at the power level x time=a weighted value. The value would be referenced by speed. When the motor flux monitor system monitors this process condition again, it records this power level×time sustained=weighted value. When the next monitored event>the stored weighted value, an alarm condition is indicated.

At the same time, the self-learning system each stored data point is recorded to have the same weight even though due to anomalies in the process, they may be rare occurrences verses regular operation.

Figure 4:
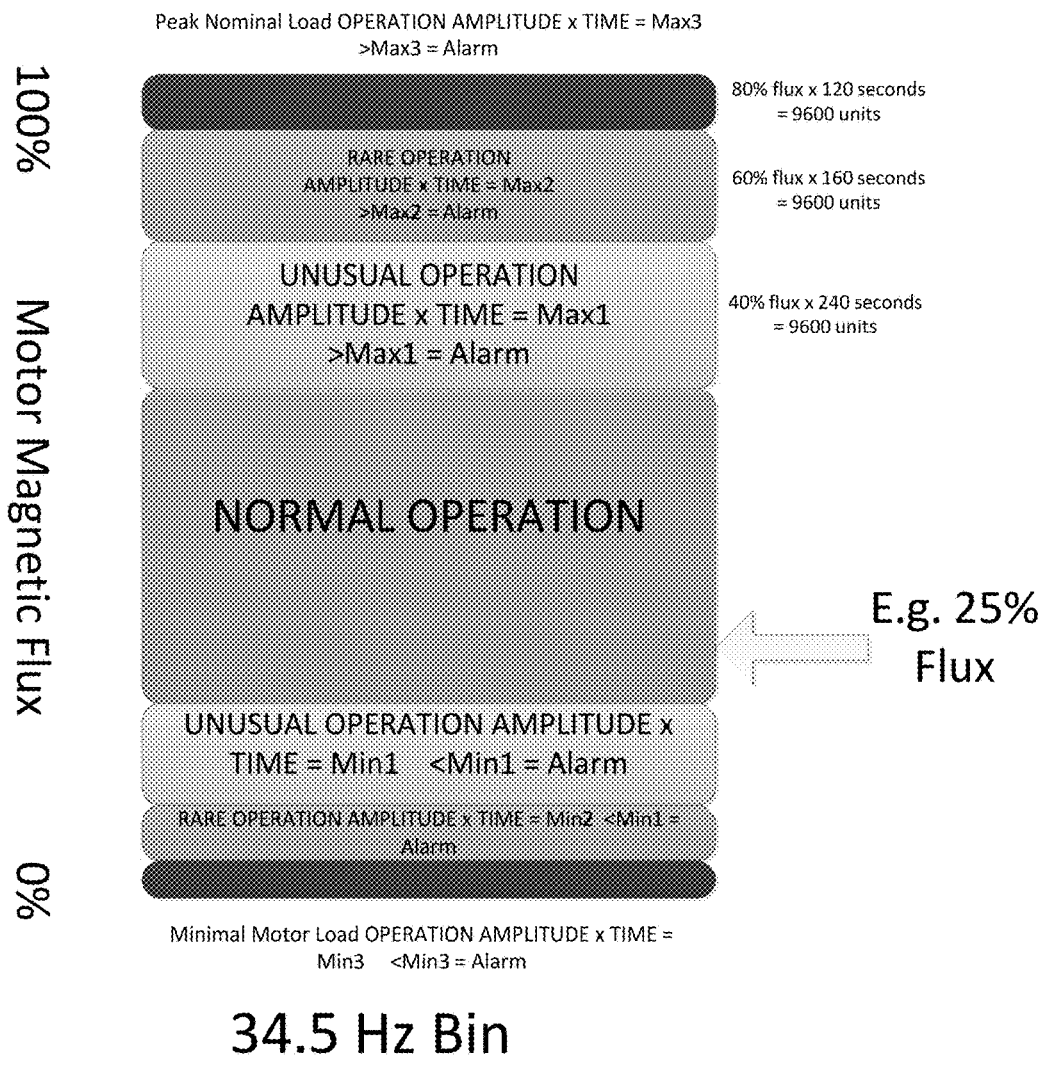
FIG. 4 shows a vertical plot of motor magnetic flux (0% to 100%) for a 34.5 Hz Bin.

This technique establishes an accurate motor load profile based off power level and time sustained for each frequency "bin". The "bin" will be it's own motor load profile slice with time weighted motor loads. See FIG. 4.

FIG. 5: The Basic Apparatus 10, Including a Pump System

FIG. 5 shows apparatus generally indicated as 10 according to some embodiments of the present invention, e.g., including a combination of a signal processor or signal processing module 10a, other signal processor circuits or components 10b, the motor 20 and the pump 30.

In operation, the signal processor or signal processor module 10a may be configured to receive signaling containing information about a sampled leakage magnetic flux sensed from a motor, a motor load profile containing a learned leakage magnetic flux sensed from the motor and stored during a learning stage, and a user selectable band of tolerance related to the motor load profile to trigger an alarm condition for the motor; and determine corresponding signaling containing information about whether to trigger the alarm condition for the motor if the sampled leakage magnetic flux is outside the user selectable band of tolerance of the motor load profile, based upon the signaling received.

By way of example, the functionality of the signal processor 10a may be implemented using hardware, software, firmware, or a combination thereof. In a typical software implementation, the signal processor or signal processing module 10a would include one or more microprocessor-based architectures having, e.g., at least one processor or microprocessor, random access memory (RAM) and/or read only memory (ROM), input/output devices and control, and data and address buses connecting the same, and/or at least one input processor and at least one output processor. A person skilled in the art would be able to program such a microcontroller (or microprocessor)-based implementation to perform the functionality described herein without undue experimentation. The scope of the invention is not intended to be limited to any particular implementation using technology either now known or later developed in the future. The scope of the invention is intended to include implementing the functionality of the signal processor as stand-alone processor or processor module, as separate processor or processor modules, as well as some combination thereof.

By way of example, after reading the instant patent application, one skilled in the art would appreciate without undue experimentation how to implement the signal processor 10a to receive the signaling containing information about the sampled leakage magnetic flux sensed from a motor, a motor load profile containing a learned leakage magnetic flux sensed from the motor and stored during a learning stage, and a user selectable band of tolerance related to the motor load profile to trigger an alarm condition for the motor. The implementation may include the signal processor 10a cooperating, or working in conjunction with, the input/output module forming part of the other component or circuitry forming part of element 10b.

By way of further example, after reading the instant patent application, one skilled in the art would appreciate without undue experimentation how to implement the signal processor 10a to determine the corresponding signaling containing information about whether to trigger the alarm condition for the motor if the sampled leakage magnetic flux is outside the user selectable band of tolerance of the motor load profile, e.g., based upon the signaling received.

The apparatus 10 may also include one or more other modules, components, etc. generally indicated as 10b for implementing other functionality associated with the apparatus, but that does not form part of the underlying invention and is not described in detail.

Figure 6:
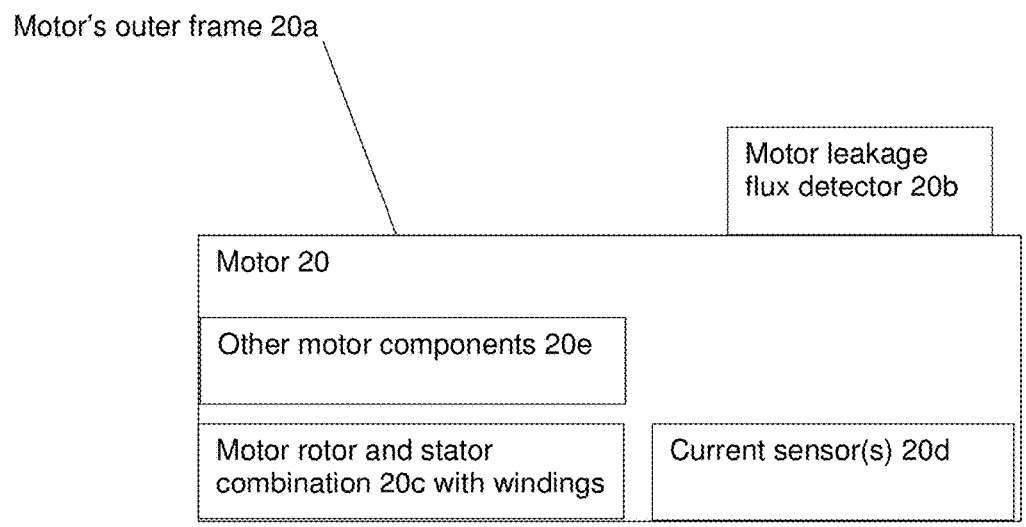
FIG. 6 shows a block diagram of a motor having an outer frame with a motor leakage flux detector arranged thereon, e.g., including a fluxgate device, according to some embodiments of the present invention.

By way of example, and consistent with that shown in FIGS. 5-6, the apparatus 10 may also include the motor 20 having the outer housing 20a with the motor leakage flux detector 20b attached thereto, e.g., as shown in FIG. 6. By way of further example, the motor 20 may also include a rotor and stator combination 20c with suitable windings, one or more the current sensors 20d, as well as other motor components 20e that are known in the art.

The Alarm Condition

By way of example, the alarm conditions may include one or more of the following:

The impeller starts to clog, flow decreases, load decreases,
Sludge or rags build up and cause binding, load increases,
Someone throttles an input valve and partial cavitation starts to occur, load decreases,
Bearings start to bind, load increases,
Impeller wear, load decreases,
Etc.

However, it is important to note that the scope of the invention is not intended to be limited to any particular type or kind of alarm condition determined for the motor, and may include alarm conditions both now known and later developed in the future. In other words, embodiments are envisioned, and the scope of the invention is intended to include, determining other types or kind of alarm conditions than that set forth herein.

FIG. 7: The Basic Method

FIG. 7 shows a flowchart 50 of a method/technique having steps for determining an alarm condition in a motor, according to some embodiments of the present invention, e.g., including implementing some combination of steps 50*a*, 50*b*, 50*c* and 50*d*. By way of example, the flowchart 50 includes, e.g., a step 50*d* for arranging the outer frame 20*a* of the motor 20 with the motor leakage flux detector 20*b* to sense the sampled leakage magnetic flux from the motor.

The Assignee's Smart Pump Technology

The present invention may be implemented alone or in conjunction with a family of Smart Pump technologies, e.g., as disclosed in the following:
patent application Ser. No. 13/859,899, filed 10 Apr. 2013,
patent application Ser. No. 13/859,936, filed 10 Apr. 2013,
patent application Ser. No. 15/227,529, filed 3 Aug. 2015,
patent application Ser. No. 15/826,616, filed 14 Aug. 2015,
which are all commonly owned by the assignee of the present application, and hereby incorporated by reference in their entirety.

The Assignee's iAlert Technology

The present invention may be implemented alone or in conjunction with a family of iAlert technologies, e.g., as disclosed in U.S. Pat. No. 8,154,417, issued 10 Apr. 2012, as well as patent application Ser. No. 14/681,577, filed 8 Apr. 2015, which are both commonly owned by the assignee of the present application, and hereby incorporated by reference in their entirety.

The Assignee's EMD Technology

The present invention may be implemented alone or in conjunction with a family of EMD technologies, e.g., as disclosed in application Ser. No. 14/681,577, filed 8 Apr. 2015, which is commonly owned by the assignee of the present application, and hereby incorporated by reference in their entirety.

The Scope of the Invention

It should be understood that, unless stated otherwise herein, any of the features, characteristics, alternatives or modifications described regarding a particular embodiment herein may also be applied, used, or incorporated with any other embodiment described herein. Also, the drawing herein is not drawn to scale.

Although the invention has been described and illustrated with respect to exemplary embodiments thereof, the foregoing and various other additions and omissions may be made therein and thereto without departing from the spirit and scope of the present invention.

What is claimed is:

1. Apparatus comprising:
a motor leakage flux detector arranged in relation to a motor, configured to detect a sample leakage magnetic flux sensed from the motor, and provide sensed signaling containing information about the sampled leakage magnetic flux sensed; and
a signal processor or signal processing module configured to:
receive the sensed signaling, and signaling containing information about a motor load profile containing a learned leakage magnetic flux sensed from the motor and stored during a learning stage, and a user selectable band of tolerance related to the motor load profile to trigger an alarm condition for the motor; and
determine corresponding signaling containing information about whether to trigger the alarm condition for the motor if the sampled leakage magnetic flux is outside the user selectable band of tolerance of the motor load profile, based upon the sensed signaling and the signaling received.

2. Apparatus according to claim 1, wherein the motor flux leakage sensor is arranged on an external surface of a frame of the motor or the motor's shaft within a magnetic field generated by the motor.

3. Apparatus according to claim 1, wherein the motor flux leakage sensor is configured to connect to the signal processor or signal processing module having memory storage.

4. Apparatus according to claim 1, wherein the motor flux leakage sensor is attached to the external surface of the frame of the motor or the motor's shaft using an adhesive, magnetic structure or mechanical fastener.

5. Apparatus according to claim 1, wherein the motor flux leakage sensor is configured to sense the sample leakage magnetic flux that produces a representative signal to a torque required to turn a shaft of the motor.

6. Apparatus according to claim 5, wherein the representative signal sensed includes an amplitude or a frequency, including where the amplitude is proportional to a load of the motor is driving or experiencing, and the frequency is proportional to the rotational speed of the motor.

7. Apparatus according to claim 1, wherein the user selectable band of tolerance is a percentage threshold of the motor load profile to trigger the alarm condition, including where the percentage threshold is user selectable of the motor load profile.

8. Apparatus according to claim 1, wherein the alarm condition contains an indication that the motor is starting to fail or that there is a change in the motor that should be investigated, including where the corresponding signaling contains information to issue an alarm.

9. Apparatus according to claim 1, wherein the user selectable band of tolerance is based off a calibrated load curve versus speed.

10. Apparatus according to claim 1, wherein the signal processor or signal processing module is configured to provide the corresponding signaling containing information about the alarm condition, including where the corresponding signaling includes wireless signaling transmitted for further processing.

11. Apparatus according to claim 1, wherein the signal processor or signal processing module is configured to implement a load curve calibration procedure during commissioning of a Variable Frequency Drive system for the motor.

12. Apparatus according to claim 1, wherein the signal processor or signal processing module is configured, during the learning stage, to store a flux magnitude as a value each time a transition is made in frequency increments.

13. Apparatus according to claim 12, wherein the signal processor or signal processing module is configured, after a predetermined number of transitions, to establish or determine the motor load profile containing the learned leakage magnetic flux sensed from the motor during the learning stage.

14. Apparatus according to claim 13, wherein the signal processor or signal processing module is configured to either average the learned leakage magnetic flux sensed and measured from the motor during the learning stage, or affix minimum and maximum values multiplied by a percentage margin, to establish or determine a motor load profile "bandwidth".

15. Apparatus according to claim 14, wherein the signal processor or signal processing module is configured to compare future leakage magnetic flux values against the motor load profile established, determined or learned.

16. Apparatus according to claim 12, wherein the signal processor or signal processing module is configured to store the value in a memory storage for compiling a set of data of the sampled leakage magnetic flux sensed to form a statistical function, such as a Probability Density Function (PDF), including to build an aggregate of values in the motor load profile.

17. Apparatus according to claim 16, wherein the signal processor or signal processing module is configured to compare input signaling containing information about the sampled leakage magnetic flux sensed in relation to a standard deviation of the statistical function, including the PDF.

18. Apparatus according to claim 16, wherein the signal processor or signal processing module is configured to determine an impact of the statistical function, including the PDF, to processing depending on a bin size of a histogram that makes up the statistical function in order to determine anomalies, as well as process changes depending on the user selectable band of tolerance.

19. Apparatus according to claim 16, wherein the signal processor or signal processing module is configured to build the motor load profile having at least one leakage magnetic flux spectrum.

20. Apparatus according to claim 19, wherein the signal processor or signal processing module is configured to implement a technique to break down the at least one leakage magnetic spectrum using a spectral shape analysis into representations of vectors and numbers, including where the technique includes using a variation of spectral detectors.

21. Apparatus according to claim 19, wherein the signal processor or signal processing module is configured to implement a Fast Fourier Transform (FFT) analysis technique during the learning stage, including by receiving sampled leakage magnetic flux signaling sensed, performing the FFT analysis technique on the sampled leakage magnetic flux signaling, storing FFT sampled leakage magnetic flux signaling in a memory storage as the motor load profile for comparing to a current magnet flux spectrum later determined in the future.

22. Apparatus according to claim 21, wherein the signal processor or signal processing module is configured to determine the current magnetic flux spectrum, compare the current magnetic flux spectrum to the motor load profile, and determine the alarm condition if the current magnetic flux spectrum varies more than a predetermined percentage from the motor load profile.

23. Apparatus according to claim 22, wherein the current magnet flux spectrum includes FFT leakage magnetic flux sensed, frequency bins and associated amplitudes at individual frequencies.

24. Apparatus according to claim 21, wherein the signal processor or signal processing module is configured, after populating the motor load profile, to compare the motor load profile to actual or sampled leakage magnetic flux values sensed, and determine the alarm condition if the actual or sampled leakage magnetic flux values sensed are outside the user selectable band of tolerance, including where the user selectable band of tolerance takes the form of an established bandwidth for a user defined period of time.

25. Apparatus according to claim 12, wherein the signal processor or signal processing module is configured to determine the alarm condition using a minimum, maximum and time based technique, including by recording and assigning a respective weight to each leakage magnetic flux data point.

26. Apparatus according to claim 12, wherein the signal processor or signal processing module is configured to determine the alarm condition using a percentage of average and time based technique, including by recording each leakage magnetic flux data point at regular intervals over a fixed period of self learning time and assigning an averaged weight.

27. A method comprising:
arranging a motor leakage flux detector in relation to a motor to detect a sampled leakage magnetic flux sensed from the motor, and provide sensed signaling containing information about the sampled leakage magnetic flux sensed; and receiving in a signal processor or signal processing module the sensed signaling, and signaling containing information about a motor load profile containing a learned leakage magnetic flux sensed from the motor and stored during a learning stage, and a user selectable band of tolerance related to the motor load profile to trigger an alarm condition for the motor; and determining in the signal processor or signal processing module corresponding signaling containing information about whether to trigger the alarm condition for the motor if the sampled leakage magnetic flux is outside the user selectable band of tolerance of the motor load profile, based upon the signaling received.

28. A method according to claim 27, wherein the method comprises sensing the leakage magnetic flux with a motor flux leakage sensor arranged on an external surface of a frame of the motor or the motor's shaft.

* * * * *